United States Patent
Niwa

(10) Patent No.: US 10,291,233 B2
(45) Date of Patent: May 14, 2019

(54) CONTROL SYSTEM AND PULSE OUTPUT DEVICE

(71) Applicant: OMRON Corporation, Kyoto (JP)

(72) Inventor: Yoshimi Niwa, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/815,708

(22) Filed: Nov. 17, 2017

(65) Prior Publication Data

US 2018/0226976 A1 Aug. 9, 2018

(30) Foreign Application Priority Data

Feb. 8, 2017 (JP) ................................. 2017-020864

(51) Int. Cl.
| | | |
|---|---|---|
| *H03K 21/40* | (2006.01) | |
| *G06F 1/04* | (2006.01) | |
| *H03K 3/78* | (2006.01) | |
| *H03K 5/19* | (2006.01) | |
| *H03K 5/00* | (2006.01) | |

(52) U.S. Cl.
CPC ............ *H03K 21/40* (2013.01); *G06F 1/04* (2013.01); *H03K 3/78* (2013.01); *H03K 5/19* (2013.01); *H03K 2005/00104* (2013.01)

(58) Field of Classification Search
CPC ................................... H03K 21/40; G06F 1/04
See application file for complete search history.

(56) References Cited

U.S. PATENT DOCUMENTS

| | | | | |
|---|---|---|---|---|
| 2003/0189414 A1* | 10/2003 | Muroi | ............... | H02P 23/16 318/400.08 |
| 2004/0012415 A1 | 1/2004 | Kouzuma | | |
| 2009/0140785 A1 | 6/2009 | Choi | | |

FOREIGN PATENT DOCUMENTS

| | | |
|---|---|---|
| EP | 1139201 | 10/2001 |
| JP | 3528890 | 5/2004 |

OTHER PUBLICATIONS

"Search Report of Europe Counterpart Application," dated May 22, 2018, p. 1-p. 9.

* cited by examiner

*Primary Examiner* — Daniel C Puentes

(74) *Attorney, Agent, or Firm* — JCIPRNET

(57) ABSTRACT

A pulse output device which corrects a pulse signal advanced or delayed from a timing prescribed by a control device and a control system including the pulse output device are provided. A PLC system including a driving device, a CPU unit, and a pulse output unit is provided. The pulse output unit includes a clock generation unit that generates a clock signal, a pulse output unit that generates a pulse signal by dividing a frequency of a clock signal and outputs the pulse signal having the number of pulses and a pulse speed commanded by the CPU unit at a prescribed timing, a pulse counter that counts the number of pulses of the output pulse signal, and a processing unit that corrects the pulse speed of the pulse signal generated by the pulse output unit based on an error in the numbers of pulses.

5 Claims, 10 Drawing Sheets

CONTROL SYSTEM AND PULSE OUTPUT DEVICE

CROSS-REFERENCE TO RELATED APPLICATION

This application claims the priority benefit of Japan application serial no. 2017-020864, filed on Feb. 8, 2017. The entirety of the above-mentioned patent application is hereby incorporated by reference herein and made a part of this specification.

BACKGROUND

Technical Field

The disclosure relates to a pulse output device which outputs a pulse signal to a driving device based on the number of pulses and a pulse speed commanded by a control device and a control system which includes the pulse output device.

Description of Related Art

Many machines and facilities used in production fields are controlled by control devices such as programmable logic controllers (which will also be referred to as PLCs). Such control devices control machines and facilities by being connected to pulse output devices which output pulse signals in compliance with commands and supplying the pulse signals output from the pulse output devices to driving devices like, for example, pulse (or stepping) motors. A configuration of such a pulse output device and a method for generating a pulse signal are disclosed in, for example, Patent Document 1.

RELATED ART DOCUMENTS

Patent Documents

[Patent Document 1] Japanese Unexamined Patent Application Publication No. 3528890

However, in a case in which a control device and a pulse output device are synchronized with each other and the pulse output device receives commands from the control device in fixed cycles and generates pulse signals in accordance with the commands, there may be an error in the pulse signals commanded by the control device due to a limit to a resolution with respect to numerical values obtained from the commands. If an error occurs in a pulse signal commanded by the control device, a pulse signal output from the pulse output device may change to a signal having a timing that is advanced or delayed from a prescribed timing.

If the pulse signal output from the pulse output device changes into a signal having a timing that is advanced or delayed from the prescribed timing, a phenomenon that the pulse signal output from the pulse output device is interrupted in midstream occurs. In a case in which a driving device driven by the pulse output device is a motor, for example, the phenomenon that a pulse signal is disconnected in midstream occurs, a pulse speed thereof thus radically changes, and thus there is concern of a strange noise or vibration occurring in the driving motor.

SUMMARY

Some embodiments of the invention provide a pulse output device that corrects a pulse signal when the pulse signal changes into a signal having a timing that is advanced or delayed from a prescribed timing and a control system that includes the pulse output device.

According to an aspect of the invention, a control system includes a driving device that is driven based on a pulse signal, a control device that commands the number of pulses and a pulse speed of a pulse signal output to the driving device, and a pulse output device that outputs a pulse signal to the driving device based on the number of pulses and a pulse speed commanded by the control device, in which the pulse output device includes a clock generation unit that generates a clock signal, a pulse output unit that generates a pulse signal by dividing a frequency of a clock signal generated by the clock generation unit and outputs the pulse signal having the number of pulses and a pulse speed commanded by the control device at a prescribed timing, a pulse counter that counts the number of pulses of a pulse signal output from the pulse output unit, and a processing unit that corrects a pulse speed of a pulse signal generated by the pulse output unit based on an error between the number of pulses commanded by the control device and the number of pulses counted by the pulse counter.

According to another aspect of the invention, a pulse output device, which outputs a pulse signal to a driving device based on the number of pulses and a pulse speed commanded by a control device, the number of pulses and the pulse speed commanded by the control device to be output to the driving device, includes a clock generation unit that generates a clock signal, a pulse output unit that generates a pulse signal by dividing a frequency of a clock signal generated by the clock generation unit and outputs the pulse signal having the number of pulses and a pulse speed commanded by the control device at a prescribed timing, a pulse counter that counts the number of pulses of a pulse signal output from the pulse output unit, and a processing unit that corrects a pulse speed of a pulse signal generated by the pulse output unit based on an error between the number of pulses commanded by the control device and the number of pulses counted by the pulse counter.

DESCRIPTION OF THE EMBODIMENTS

Figure 1:
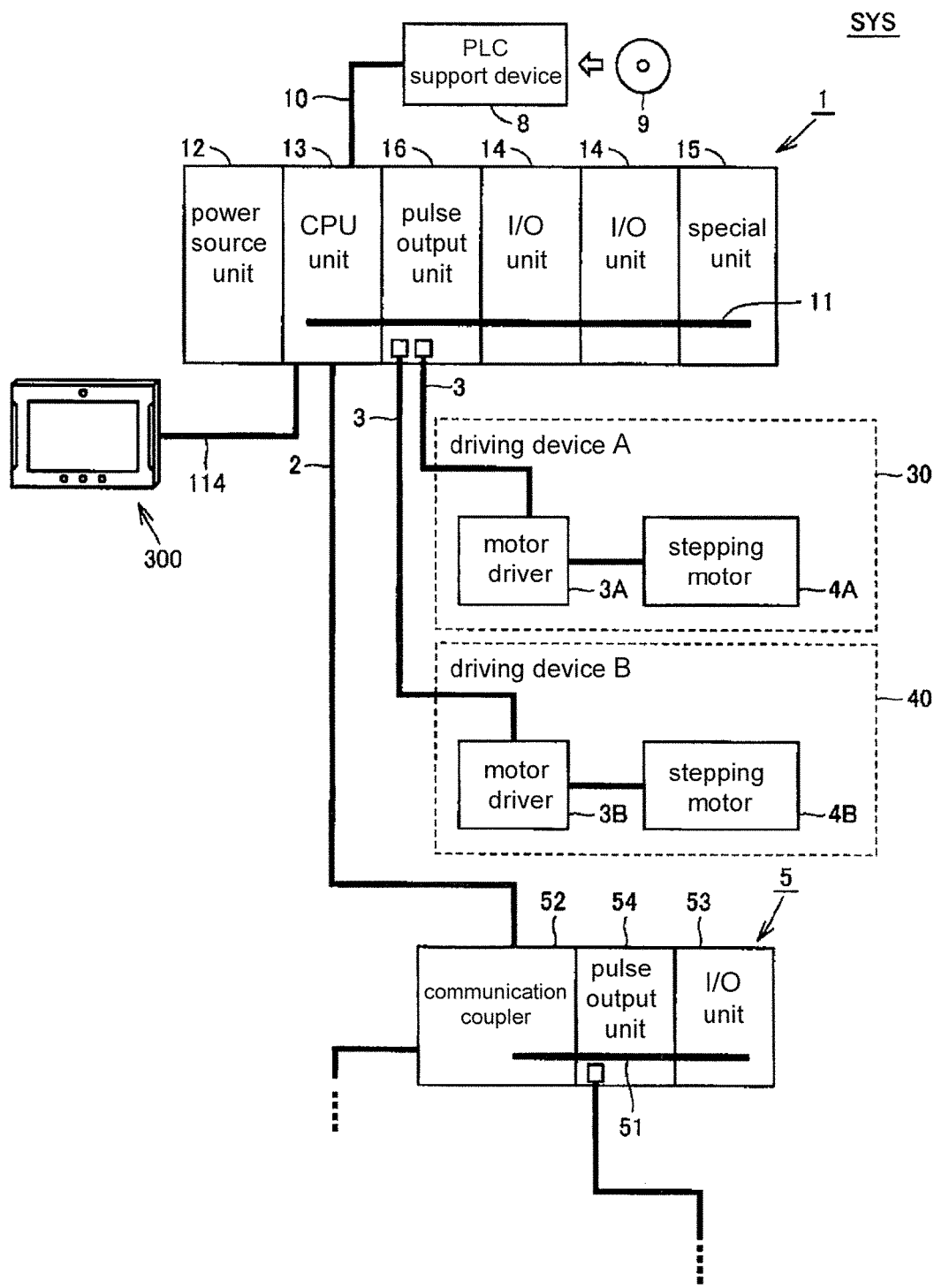
FIG. 1 is a schematic diagram showing an outline configuration of a control system according to an embodiment of the present technology.

According to the control system of one or some exemplary embodiments of the present technology, a pulse output device can suppress a radical change in a pulse speed of a pulse signal having a timing that is advanced or delayed from a prescribed timing by correcting the pulse signal.

In one or some of exemplary embodiments of the invention, the control device commands the number of pulses of a pulse signal by commanding a position, and the pulse output device obtains the number of pulses of a pulse signal commanded based on a difference between a position commanded this time and a position commanded at a previous time.

In one or some of exemplary embodiments of the invention, the processing unit corrects, when a pulse signal output from the pulse output unit is advanced from the prescribed timing, a pulse speed such that it becomes slower than a pulse speed commanded by the control device, and when a pulse signal output from the pulse output unit is delayed from the prescribed timing, a pulse speed such that it becomes faster than the pulse speed commanded by the control device.

In one or some of exemplary embodiments of the invention, the processing unit corrects a speed of one pulse of a pulse signal for each control cycle in which the control device commands the number of pulses and a pulse speed.

The embodiments will be described in detail below with reference to the accompanying drawings. Note that constituent parts having the same reference signs in the drawings are the same parts or parts equivalent thereto.

(A. Configuration of Control System)

A control system according to an embodiment has a control function of controlling a driving device (e.g., a stepping motor) based on a command issued by a CPU unit that is a control device and causes a pulse output device to generate a pulse signal in accordance with a command from the CPU unit and outputs the signal to the driving device. First, a configuration of the control system according to the present embodiment will be described with reference to FIG. 1.

FIG. 1 is a schematic diagram showing an outline configuration of the control system according to the present embodiment. A PLC system SYS that is a control system includes a PLC 1, motor drivers 3A and 3B, stepping motors 4A and 4B, and a remote I/O terminal 5. The motor drivers 3A and 3B are connected to a pulse output unit 16 of the PLC 1 via signal wiring 3 respectively. The remote I/O terminal 5 is connected to the PLC 1 via a field network 2. In addition, the PLC 1 is respectively connected to a PLC support device 8 via a connection cable 10 or the like and to a programmable display 300 via a network 114.

The motor driver 3A drives the stepping motor 4A based on a pulse signal. A driving device 30 is constituted by the motor driver 3A and the stepping motor 4A. The motor driver 3B drives the stepping motor 4B based on pulse signals. A driving device 40 is constituted by the motor driver 3B and the stepping motor 4B.

Each of the constituent elements will be described in more detail. The PLC 1 includes a CPU unit 13 which executes major arithmetic processes, one or more I/O units 14, a special unit 15, and a pulse output unit 16. The pulse output unit 16 is a pulse output device which generates pulse signals in accordance with commands from the CPU unit 13 and outputs the generated pulse signals to the motor drivers 3A and 3B via the signal wiring 3 respectively. Details of the pulse output unit 16 will be described below with reference to FIG. 5.

Units included in the PLC 1 are configured to exchange data with each other via a PLC system bus 11. In addition, the units receive supply of power having an appropriate voltage from a power source unit 12. Note that, since the units constituting the PLC 1 are provided by a manufacturer of the PLC, the PLC system bus 11 is independently developed by each of manufacturers of PLCs and used. On the other hand, there are many cases with respect to the field network 2 in which the standards of field network products produced by different manufacturers are disclosed so that the products can be connected to each other. Note that, although the CPU unit 13 and the pulse output unit 16 are connected via the PLC system bus 11 in the PLC 1, the CPU unit 13 and the pulse output unit 16 may be connected via the field network 2.

Figure 2:
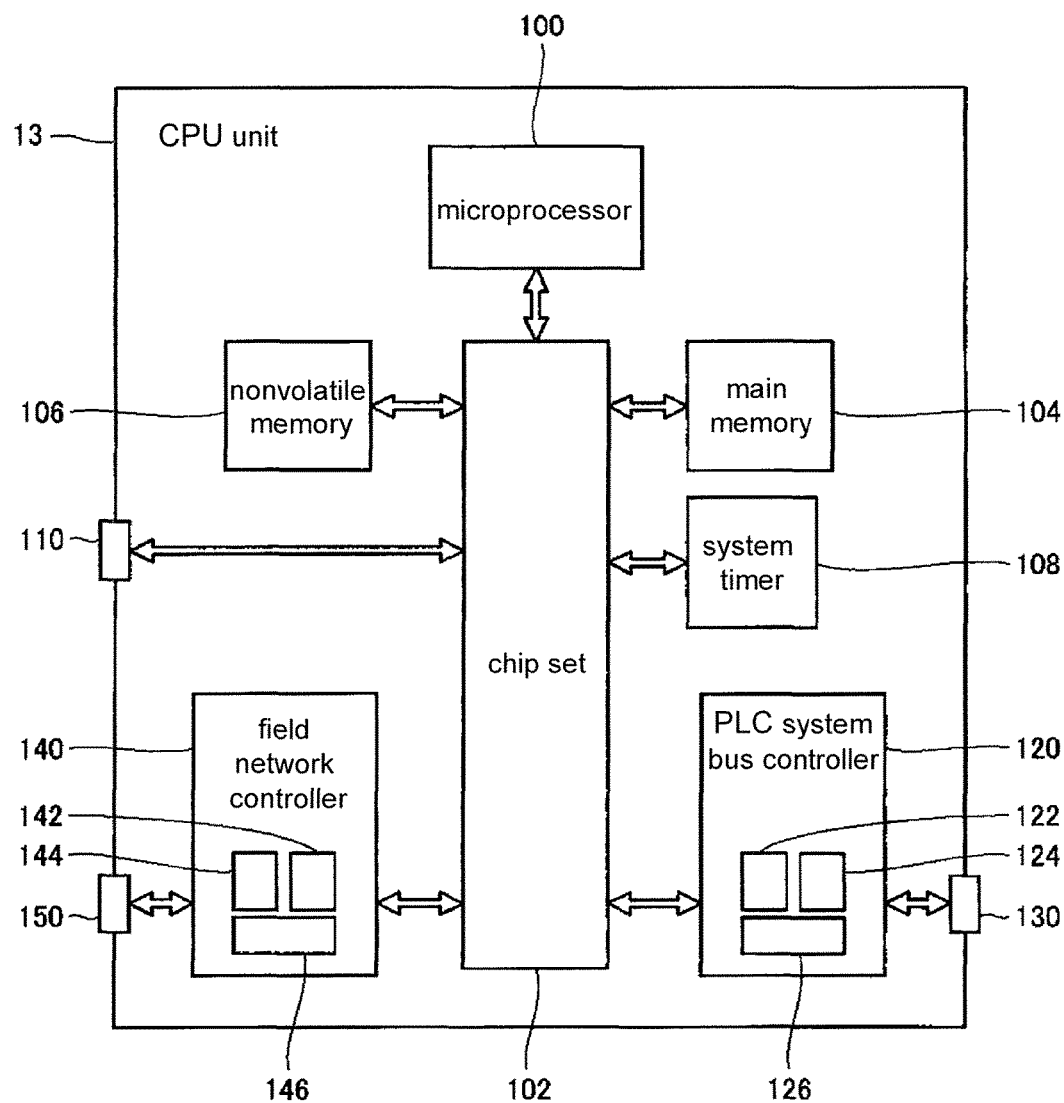
FIG. 2 is a schematic diagram showing a hardware configuration of a CPU unit according to the embodiment.

Details of the CPU unit 13 will be described below with reference to FIG. 2. The I/O units 14 are related to general input and output processes and perform input and output of data binarized as an on- or off-state. That is, the I/O units 14 collect information indicating a state in which a sensor has detected a target (an on-state) and information indicating a state in which the sensor has not detected a target (an off-state). In addition, the I/O units 14 output any of a command for activation (an on-state) or a command for inactivation (an off-state) to an output destination such as a relay or an actuator.

The special unit 15 has functions that the I/O units 14 are not capable of supporting, including input and output of analog data, control of temperature, and communication using a specific communication scheme.

The field network 2 transmits various kinds of data to be exchanged with the CPU unit 13. As the field network 2, any typical network of various kinds such as industrial Ethernet (registered trademark) can be used. As the industrial Ethernet (registered trademark), for example, EtherCAT (registered trademark), Profhet IRT, MECHATROLINK (registered trademark)-III, Powerlink, SERCOS (registered trademark)-III, CIP Motion, and the like are known, and any of these networks can be employed. Furthermore, a field network other than industrial Ethernet (registered trademark) can be used. In a case in which motion control is not performed, for example, DeviceNet, CompoNet (registered trademark), or the like can be used. A configuration of the PLC system SYS according to the present embodiment in which typical EtherCAT (registered trademark) that is industrial Ethernet (registered trademark) is employed as the field network 2 will be exemplified.

Note that, although the PLC system SYS having both the PLC system bus 11 and the field network 2 has been exemplified in FIG. 1, a system configuration in which either of them is installed can be employed. For example, all of the units of the system may be connected via the field network 2. Furthermore, a communication unit of the field network 2 may be connected to the PLC system bus 11 so that communication between the CPU unit 13 and apparatuses connected to the field network 2 is realized via the communication unit.

The motor drivers 3A and 3B are connected to the pulse output unit 16 via the signal wiring 3 respectively and drive the stepping motors 4A and 4B in accordance with a pulse signal from the pulse output unit 16. More specifically, the pulse output unit 16 receives command values such as a commanded position and a commanded speed from the CPU unit 13 in fixed cycles. The pulse output unit 16 outputs a pulse signal in accordance with the received command values to the motor drivers 3A and 3B. The motor drivers 3A and 3B adjust currents for driving the stepping motors 4A and 4B based on the pulse signal. Note that the motor drivers 3A and 3B may be referred to as motor amplifiers. In addition, the motor drivers 3A and 3B can also acquire actually measured values relating to operations of the stepping motors 4A and 4B, such as a position (typically calculated from a difference between a current position and a previous position), a speed, and a torque from a detector such as a position sensor (a rotary encoder) or a torque sensor connected to shafts of the stepping motors 4A and 4B.

With regard to the PLC system SYS shown in FIG. 1, although the example of the system in which the stepping motors 4A and 4B and the motor drivers 3A and 3B are combined has been described, a system in which the motors and the drivers are combined with a device which performs control using pulse signals can also be employed.

The field network 2 of the PLC system SYS shown in FIG. 1 is further connected to the remote I/O terminal 5. The remote I/O terminal 5 basically performs general processes relating to input and output, like the I/O units 14. More specifically, the remote I/O terminal 5 includes a communication coupler 52 for performing a process relating to data transmission on the field network 2 and one or more I/O units 53. Further, the remote I/O terminal 5 may also include a pulse output unit 54. Although not illustrated, the pulse output unit 54 is connected to the motor drivers and the stepping motors via signal wiring. Thus, the CPU unit 13 can output command values of a commanded position and a commanded speed to the pulse output unit 54 via the field network 2. The units described in this paragraph are configured to exchange data with each other via a remote I/O terminal bus 51.

In the PLC system SYS, the CPU unit 13 of the PLC 1 functions as a master device in EtherCAT, and the motor drivers 3A and 3B and the communication coupler 52 function as slave devices in EtherCAT. Note that a unit which functions as a master device may be provided instead of the CPU unit 13.

Note that the PLC support device 8 is a device used by a user to generate a project including a user program, system configuration information indicating a system configuration (a device configuration), a variable table, and the like. A hardware configuration of the PLC support device 8 is typically configured with a general-purpose computer. Specifically, although not illustrated, the PLC support device 8 includes a CPU, a ROM, a RAM, a hard disk (HDD), a keyboard and a mouse, a display, a communication interface (IF), and the like. Various programs executed by the PLC support device 8 are stored in a compact disc-read only memory (CD-ROM) 9 and distributed. Note that the programs may be downloaded from a higher-order host computer or the like via a network.

The programmable display 300 can display various kinds of information acquired from the PLC 1 on a screen and change input variable values, the number of pulses of pulse signals, pulse speeds, and the like stored in the PLC 1 through operations of a user. A hardware configuration of the programmable display 300 includes a CPU, a ROM, a RAM, a flash ROM, a timer, operation keys, a camera, a touch screen, a communication interface, and the like.

(B. Hardware Configuration of CPU Unit)

Next, a hardware configuration of the CPU unit 13 will be described with reference to FIG. 2. FIG. 2 is a schematic diagram showing a hardware configuration of the CPU unit according to the present embodiment. Referring to FIG. 2, the CPU unit 13 includes a microprocessor 100, a chip set 102, a main memory 104, a non-volatile memory 106, a system timer 108, a PLC system bus controller 120, a field network controller 140, and a USB connector 110. The chip set 102 and other components are linked to each other via various buses.

The microprocessor 100 and the chip set 102 are typically configured based on general-purpose computer architecture. That is, the microprocessor 100 performs execution by interpreting instruction codes sequentially supplied from the chip set 102 in accordance with an internal clock. The chip set 102 exchanges internal data with various connected components and generates instruction codes necessary for the microprocessor 100. Furthermore, the chip set 102 has a function of caching data and the like obtained as a result of execution of arithmetic processes by the microprocessor 100.

The CPU unit 13 has the main memory 104 and the non-volatile memory 106 as memory devices.

The main memory 104 is a volatile memory area (a RAM) and retains various programs to be executed by the microprocessor 100 after power is input to the CPU unit 13. In addition, the main memory 104 is also used as a work memory when various programs are executed by the microprocessor 100. As the main memory 104, a device such as a dynamic random access memory (DRAM) or a static random access memory (SRAM) is used.

Meanwhile, the non-volatile memory 106 holds a real time operating system (OS), a system program of the PLC 1, a user program, a motion arithmetic program, and data including system setting parameters in a non-volatile manner. These programs and data are copied in the main memory 104 to allow the microprocessor 100 to access them if necessary. As the non-volatile memory 106, a semiconductor memory such as a flash memory can be used. Alternatively, a magnetic recording medium such as a hard disk drive, an optical recording medium such as a digital versatile disc random access memory (DVD-RAM), or the like can be used.

The system timer 108 generates an interruption signal in fixed cycles and provides the signal to the microprocessor 100. Although interruption signals are typically configured to be generated in a plurality of different cycles depending on hardware specifications, interruption signals can be set to be generated in arbitrary cycles depending on an operating system (OS), a basic input/output system (BI/OS), and the like. Using the interruption signals generated by the system timer 108, control operations are realized in each motion control cycle as will be described below.

The CPU unit 13 has the PLC system bus controller 120 and the field network controller 140 as communication circuits.

A buffer memory 126 functions as a transmission buffer with respect to data output to other units (which will also be referred to as "output data") via the PLC system bus 11 and a reception buffer with respect to data input from other units (which will also be referred to as "input data") via the PLC system bus 11. Note that output data created through an arithmetic process performed by the microprocessor 100 is primarily stored in the main memory 104. Then, output data to be transferred to a specific unit is read from the main memory 104 and then temporarily held in the buffer memory 126. In addition, input data transferred from another unit is temporarily held in the buffer memory 126 and then transferred to the main memory 104.

A DMA control circuit 122 performs transfer of output data from the main memory 104 to the buffer memory 126 and transfer of input data from the buffer memory 126 to the main memory 104.

A PLC system bus control circuit 124 performs a process of transmitting output data of the buffer memory 126 and a process of receiving input data and storing the data in the buffer memory 126 with respect to another unit connected to the PLC system bus 11. The PLC system bus control circuit 124 typically provides functions of a physical layer and a data link layer of the PLC system bus 11.

The field network controller 140 controls exchanges of data via the field network 2. That is, the field network controller 140 controls transmission of output data and reception of input data in accordance with a standard of the field network 2 in use. Since the field network 2 in compliance with the standard of EtherCAT (registered trademark) is employed in the present embodiment as described above, the field network controller 140 including hardware for performing normal Ethernet (registered trademark) communication is used. Under the standard of EtherCAT (registered trademark), a general Ethernet (registered trademark) controller can be used to realize a communication protocol in accordance with the general Ethernet (registered trademark) standard. However, depending on a type of industrial Ethernet (registered trademark) employed in the field network 2, an Ethernet (registered trademark) controller having special specifications corresponding to a communication protocol having dedicated specifications, which is different from a general communication protocol, may be used. In addition, in a case in which a field network other than industrial Ethernet (registered trademark) is employed, a field network controller dedicated thereto in accordance with a standard of the scheme is used.

A DMA control circuit 142 performs transfer of output data from the main memory 104 to the buffer memory 146 and transfer of input data from the buffer memory 146 to the main memory 104.

A field network control circuit 144 performs a process of transmitting output data of the buffer memory 146 and a process of receiving input data and storing the data in the buffer memory 146 with respect to another device connected to the field network 2. The field network control circuit 144 typically provides functions of a physical layer and a data link layer of the field network 2.

The USB connector 110 is an interface for connecting the PLC support device 8 to the CPU unit 13. A program or the like which is transmitted from the PLC support device 8 and can be executed by the microprocessor 100 of the CPU unit 13 is typically taken to the PLC 1 via the USB connector 110.

(C. Software Configuration of CPU Unit)

Next, a software group for providing various functions according to the present embodiment will be described with reference to FIG. 3. Instruction codes included in software are read at appropriate timings and executed by the microprocessor 100 of the CPU unit 13.

Figure 3:
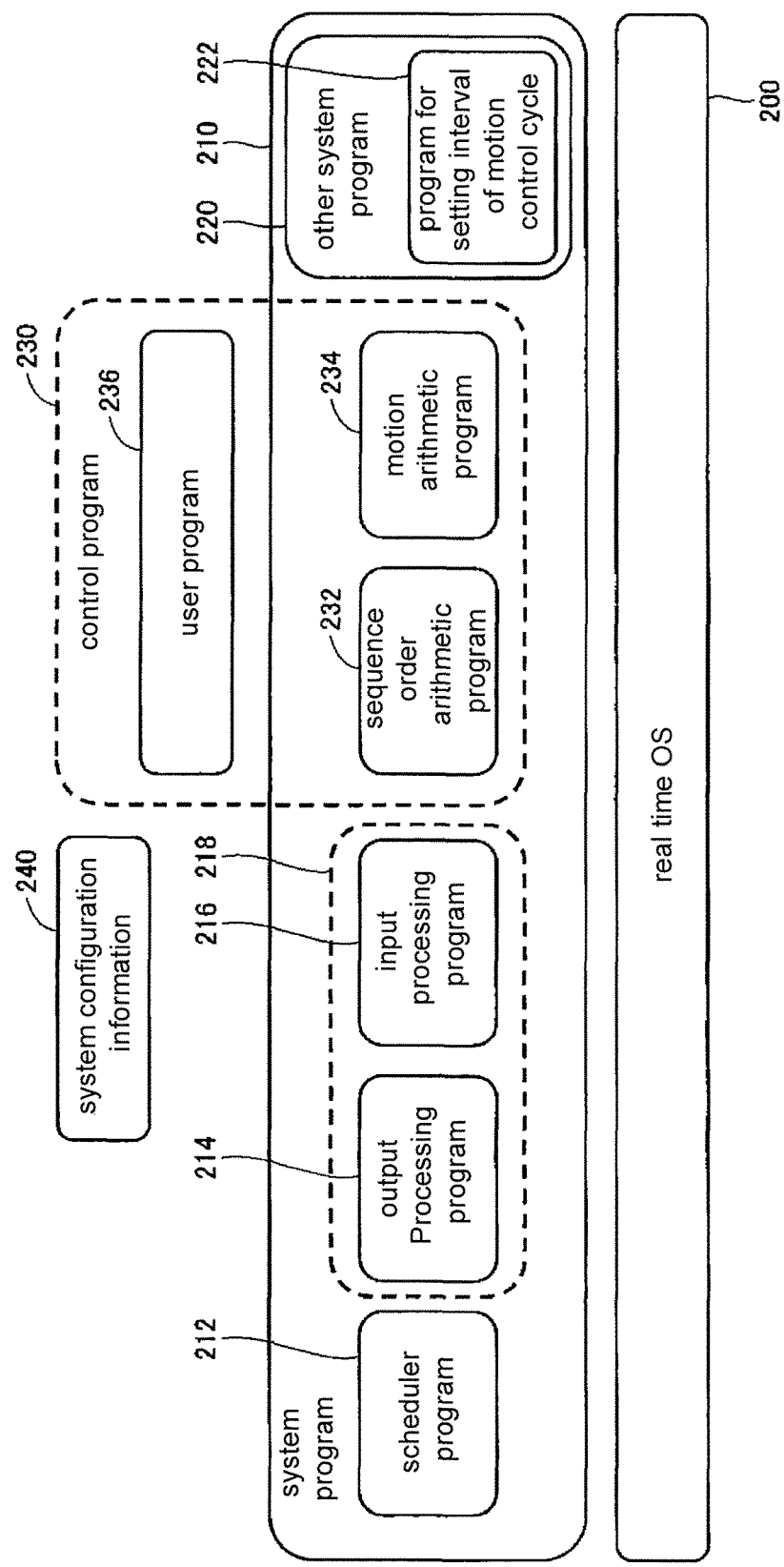
FIG. 3 is a schematic diagram showing a software configuration in which software is executed by the CPU unit according to the embodiment.

FIG. 3 is a schematic diagram showing a software configuration in which software is executed by the CPU unit according to the present embodiment. Referring to FIG. 3, the software executed by the CPU unit 13 has three tiers of a real time OS 200, a system program 210, and a user program 236.

The real time OS 200 is designed in accordance with computer architecture of the CPU unit 13 and provides a fundamental execution environment for the microprocessor 100 to execute the system program 210 and the user program 236. The real time OS is typically provided by a manufacturer of the PLC, a professional software company, or the like.

The system program 210 is a software group for providing functions of the PLC 1. Specifically, the system program 210 includes a scheduler program 212, an output processing program 214, an input processing program 216, a sequence order arithmetic program 232, a motion arithmetic program 234, and other system programs 220. Note that, since the output processing program 214 and the input processing program 216 are executed in a consecutive (integrated) manner in general, the programs can be collectively called an I/O processing program 218.

The user program 236 is created in accordance with a control objective of a user. That is, it is a program arbitrarily designed in accordance with a line (a process) to be controlled using the PLC system SYS.

The user program 236 realizes a control objective of a user in cooperation with the sequence order arithmetic program 232 and the motion arithmetic program 234. That is, the user program 236 realizes programmed operations by using orders, functions, function modules, and the like provided by the sequence order arithmetic program 232 and the motion arithmetic program 234. Thus, the user program 236, the sequence order arithmetic program 232, and the motion arithmetic program 234 can be collectively called a control program 230.

As described above, the microprocessor 100 of the CPU unit 13 executes the system program 210 and the user program 236 stored in the memory device.

Each of the programs will be described in more detail below. The user program 236 is created in accordance with a control objective (e.g., a target line or process) of a user as described above. The user program 236 typically has an object program form that can be executed by the microprocessor 100 of the CPU unit 13. The user program 236 is generated by compiling source programs described in a ladder language and the like in the PLC support device 8 or the like. In addition, the generated user program 236 having the object program form is transferred from the PLC support device 8 to the CPU unit 13 via the connection cable 10 and stored in the non-volatile memory 106 or the like.

The scheduler program 212 controls process resumption after a process starts and stops in each execution cycle with respect to the output processing program 214, the input processing program 216, and the control program 230. More specifically, the scheduler program 212 controls execution of the user program 236 and the motion arithmetic program 234.

The CPU unit 13 according to the present embodiment employs a fixed execution cycle (a motion control cycle) appropriate for the motion arithmetic program 234 as a cycle common to all processes. Thus, since it is difficult to complete all processes in one motion control cycle, the processes are divided into processes of which execution need to be completed in each motion control cycle and processes that may be executed through a plurality of motion control cycles in accordance with priorities or the like of processes to be executed. The scheduler program 212 manages an execution order of the separate processes. More specifically, the scheduler program 212 executes a program having higher priority first in each motion control cycle.

The output processing program 214 rearranges output data generated through execution of the user program 236 (the control program 230) in a format appropriate for being transferred to the PLC system bus controller 120 and/or the field network controller 140. When the PLC system bus controller 120 and/or the field network controller 140 require an instruction for executing transmission from the microprocessor 100, the output processing program 214 issues such an instruction.

The input processing program 216 rearranges input data received by the PLC system bus controller 120 and/or the field network controller 140 in a format appropriate for the control program 230 to use.

The sequence order arithmetic program 232 is a program called out when a sequence order of a type used by the user program 236 is executed and executed to realize the details of the order. For example, a program for generating two-dimensional shape data of a target based on measurement data obtained from a measurement device and a program for computing a feature amount such as a height or a cross-sectional area using the generated shape data are included in the sequence order arithmetic program 232.

The motion arithmetic program 234 is a program that is executed in accordance with an instruction of the user program 236, and is for reading measurement information from a controller 6 and calculating a commanded position to be output to the motor drivers 3A and 3B, or the like.

The other system programs 220 indicate a group of programs for realizing all sorts of functions of the PLC 1 except for the individual programs shown in FIG. 3. The other system programs 220 include a program for setting a time interval of the motion control cycle 222.

An interval of the motion control cycle can be appropriately set in accordance with a control objective. Typically a user inputs information for designating an interval of the motion control cycle to the PLC support device 8. Then, the input information is transferred from the PLC support device 8 to the CPU unit 13. The program for setting an interval of the motion control cycle 222 causes the information from the PLC support device 8 to be stored in the non-volatile memory 106 and sets the system timer 108 so that an interruption signal is generated in motion control cycles designated by the system timer 108. When the program for setting an interval of the motion control cycle 222 is executed when power is input to the CPU unit 13, the information for designating the interval of the motion control cycle is read from the non-volatile memory 106 and the system timer 108 is set in accordance with the read information.

As a form of information for designating an interval of the motion control cycle, the value of a time indicating the interval of the motion control cycle, information (a number or a letter) specifying one of a plurality of options provided for the interval of the motion control cycle in advance, or the like can be employed.

In the CPU unit 13 according to the present embodiment, a means for setting an interval of the motion control cycle corresponds to an element used to arbitrarily set an interval of a motion control cycle having the configuration of a communication means with respect to the PLC support device 8 that is used to acquire the information for designating an interval of the motion control cycle, the program for setting an interval of the motion control cycle 222, and the system timer 108 configured to arbitrarily set an interval of an interruption signal that regulates the motion control cycle.

The real time OS 200 provides an environment in which the plurality of programs can be executed in a switching manner as time elapses. In the PLC 1 according to the present embodiment, as an event (interruption) for outputting (transmitting) output data generated through execution of a program by the CPU unit 13 to another unit or another device, output preparation interruption (P) and field network transmission interruption (X) are initially set. When output preparation interruption (P) or field network transmission interruption (X) occurs, the real time OS 200 switches an execution target of the microprocessor 100 from a program being executed when the interruption occurs to the scheduler program 212. Note that, when neither the scheduler program 212 nor a program of which execution is controlled by the scheduler program 212 is executed, the real time OS 200 executes a program included in the system program 210. Such a program includes, for example, a program relating to a communication process between the CPU unit 13 and the PLC support device 8 via the connection cable 10 (USB) or the like.

(D. Pulse Output Configuration of Control System)

Figure 4:
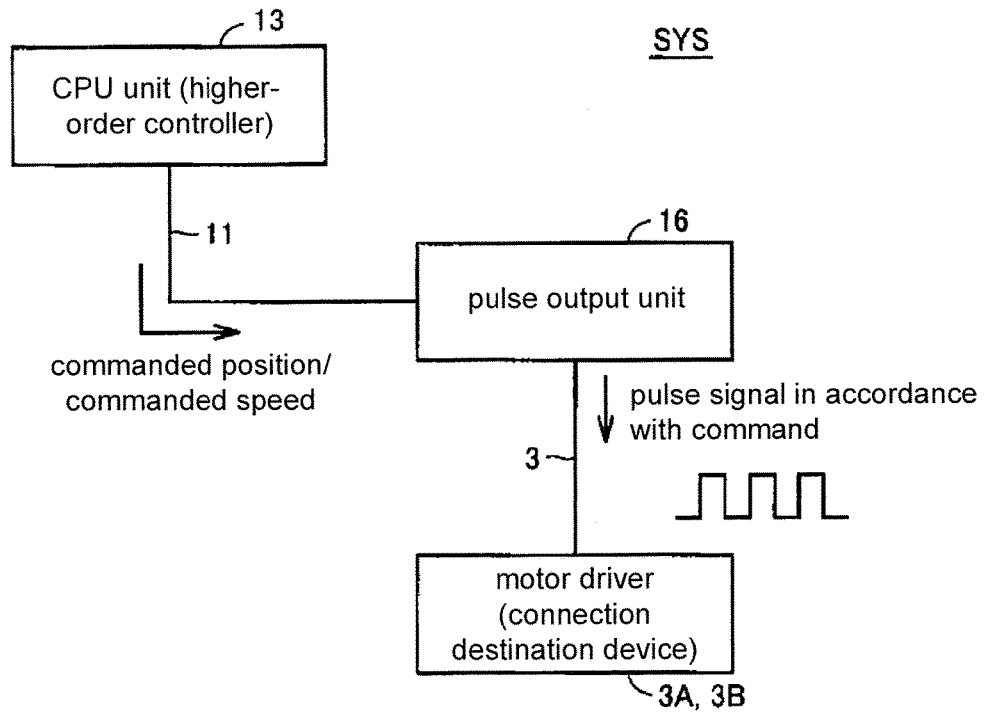
FIG. 4 is a block diagram showing a pulse output configuration of the control system according to the embodiment.

Next, when the PLC 1 of the PLC system SYS executes the sequence order arithmetic program 232 and the motion arithmetic program 234, the CPU unit 13 gives a command of commanded position and a commanded speed to the pulse output unit 16. The pulse output unit 16 outputs a pulse signal to the motor drivers 3A and 3B in accordance with the commands. Further in the PLC system SYS, the motor drivers 3A and 3B drive the stepping motors 4A and 4B based on the pulse signal. Specifically, a configuration of pulse output of the PLC system SYS serving as a control system will be described with reference to the drawings. FIG. 4 is a block diagram showing a pulse output configuration of the control system according to the present embodiment.

The PLC system SYS has the CPU unit 13 serving as a higher-order controller, the pulse output unit 16, and the motor drivers 3A and 3B. The CPU unit 13 and the pulse output unit 16 are connected to each other via the PLC system bus 11, and thus the CPU unit 13 outputs command values including commanded positions and commanded speeds to the pulse output unit 16. The pulse output unit 16 and the motor drivers 3A and 3B are connected to each other via the signal wiring 3 respectively, and thus the pulse output unit 16 outputs a pulse signal to the motor drivers 3A and 3B in accordance with the command.

The CPU unit 13 serving as a higher-order controller outputs command values for outputting a pulse signal to the pulse output unit 16 via the PLC system bus 11 in fixed cycles. Here, the fixed cycle is also called a control cycle. The pulse output unit 16 also generates and outputs a pulse signal at a timing determined for the pulse output unit 16 in advance as a system setting in each control cycle based on the command values input in each control cycle. That is, the CPU unit 13 serving as a higher-order controller and the pulse output unit 16 are synchronized with each other via the PLC system bus 11. As a synchronization method, for example, a method such as a distributed clock synchronization based on the IEEE 1588 standard or the like is used. The CPU unit 13 gives position data (a commanded position) and speed data (a commanded speed), both of which are composed of integer numbers, to the pulse output unit 16 as the output command values. Here, the position data (a commanded position) and speed data (a commanded speed) can be defined as, for example, "commanded position" and "command velocity" of the CiA 402 standard. For example, when an application that controls a motor is executed by the CPU unit 13, the CPU unit 13 outputs position data (a commanded position) and speed data (a commanded speed) for controlling a rotation angle and a rotation speed of the motor to the pulse output unit 16.

The PLC system bus 11 is a communication network on which the CPU unit 13 and the pulse output unit 16 exchange data with each other. A communication network connecting the CPU unit 13 and to pulse output unit 16 is not limited to the PLC system bus 11 and may be the field network 2. Any communication network used between the CPU unit 13 and the pulse output unit 16 can be used as long as the network includes at least a synchronization means for synchronizing the CPU unit 13 with the pulse output unit 16. In addition, the CPU unit 13 and the pulse output unit 16 may be connected to each other through a plurality of communication networks. However, in that case, a coupler device connecting the communication networks is required to have a function of securing synchronization between the communication networks.

Figure 5:
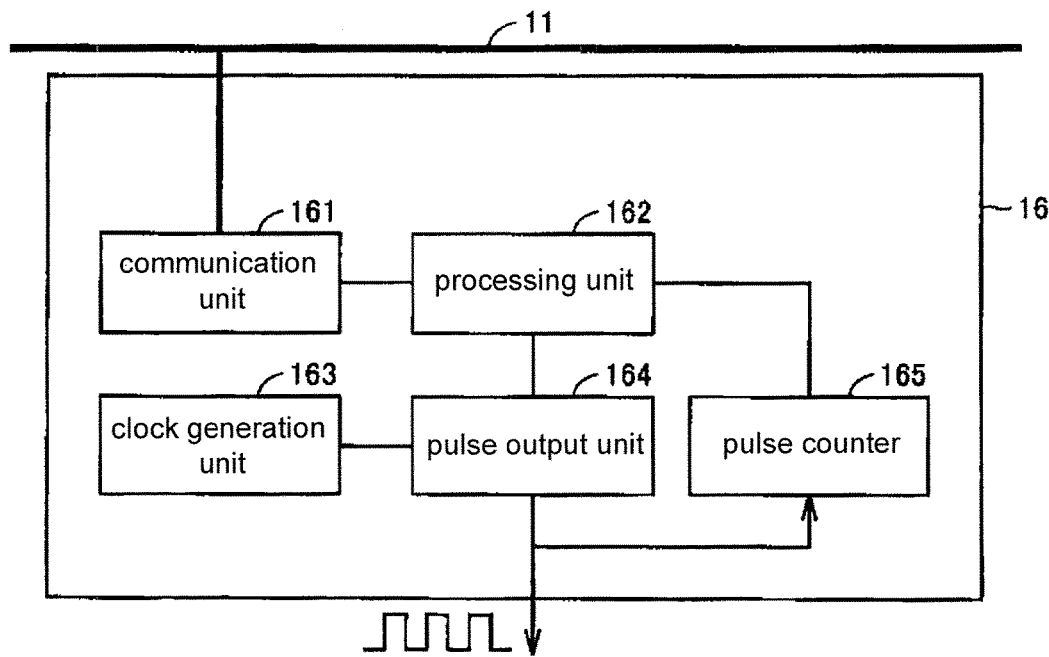
FIG. 5 is a block diagram showing a functional configuration of a pulse output unit according to the embodiment.

The pulse output unit 16 which generates a pulse signal in accordance with a command will be described in more detail. FIG. 5 is a block diagram showing a functional configuration of the pulse output unit 16 according to the present embodiment. The pulse output unit 16 shown in FIG. 5 has a communication unit 161, a processing unit 162, a clock generation unit 163, a pulse output unit 164, and a pulse counter 165. Note that, although not illustrated, the pulse output unit 16 includes a CPU, a ROM, a RAM, and the like. The communication unit 161 is a communication interface (IF) and is a component that exchanges data with the CPU unit 13 via the PLC system bus 11. The communication unit 161 has a means that is synchronized with the CPU unit 13 via the PLC system bus 11. The communication unit 161 receives position data (a commanded position) and speed data (a commanded speed) as command values from the CPU unit 13.

The processing unit 162 calculates the number of pulses and a pulse frequency (a pulse speed) to be output in each control cycle based on the received command values. To calculate the number of pulses and the pulse frequency, the processing unit 162 receives from the pulse counter 165 information of the number of pulses actually output from the pulse output unit 164 and corrects the calculated pulse frequency. The processing unit 162 outputs the calculated number of pulses and pulse frequency to the pulse output unit 164 to perform control such that a pulse signal to be output in the control cycle can be output from the pulse output unit 164.

The pulse output unit 164 generates and outputs a pulse signal by dividing a frequency of a clock signal generated by the clock generation unit 163 based on the number of pulses and the pulse frequency calculated by the processing unit 162. The pulse counter 165 counts the number of pulses of the pulse signal output by the pulse output unit 164 and gives feedback to the processing unit 162.

Figure 6A:
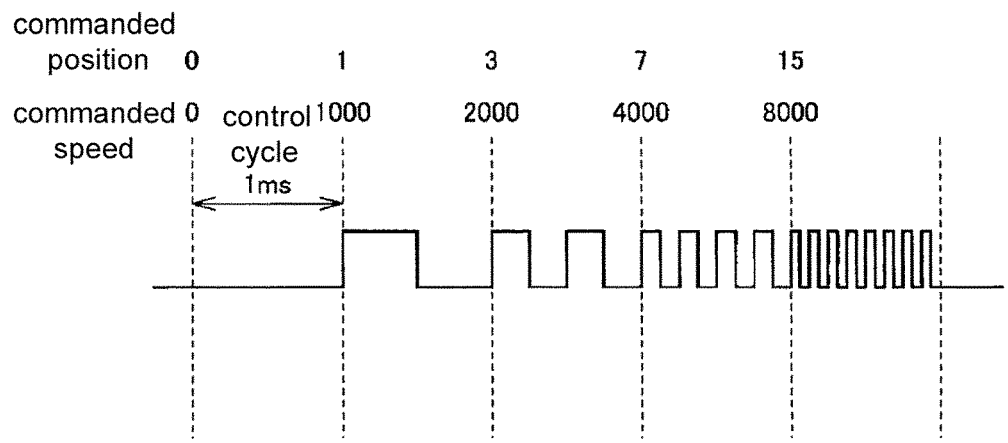
FIG. 6A and FIG. 6B are diagrams for describing instructed positions and instructed speeds.
Figure 6B:
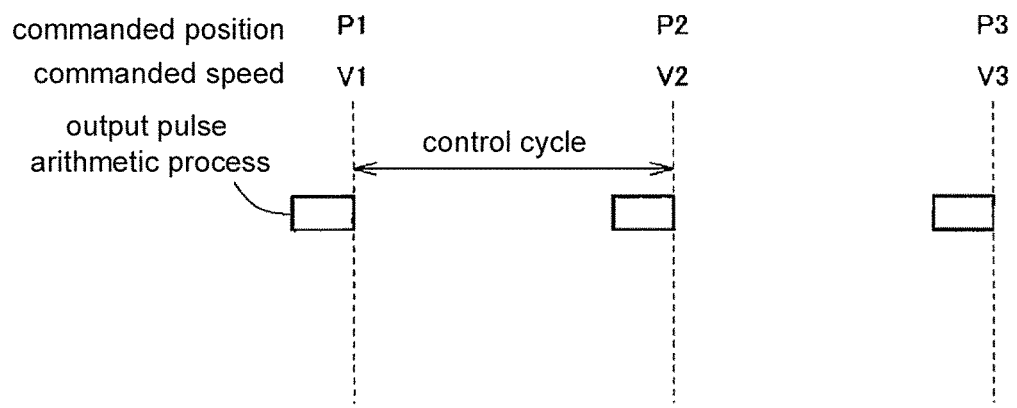

Next, a relation between commanded positions and commanded speeds and a pulse signal will be described in more detail. FIG. 6A and FIG. 6B are diagrams for describing commanded positions and commanded speeds. The waveform shown in FIG. 6A is a waveform of a pulse signal when a commanded position and a commanded speed are given. When, for example, a command is given to set a control cycle time to 1 ms, a commanded position to 1, and a commanded speed to 1000 pulses per second (pps), the pulse signal has a waveform with one pulse and a pulse frequency of 1000 pps. Next, when a command is given to set a commanded position to 3 and a commanded speed to 2000 pps, the pulse signal has a waveform with two pulses and a pulse frequency of 2000 pps. Note that the number of pulses is 2 which is obtained by subtracting 1, which is the previous commanded position, from 3, which is the current commanded position. Furthermore, when a command is given to set a commanded position to 7 and a commanded speed to 4000 pps, the pulse signal has a waveform with four pulses and a pulse frequency of 4000 pps, and when a command is given to set a commanded position to 15 and a commanded speed to 8000 pps, the pulse signal has a waveform with 8 pulses and a pulse frequency of 8000 pps.

Upon receiving a commanded position and a commanded speed in each control cycle, the processing unit 162 calculates the number of pulses and a pulse frequency of a pulse signal output in the control cycle and causes the pulse output unit 164 to output the pulse signal having the waveform shown in FIG. 6A. The specific process performed by the processing unit 162 is performed at a timing of an output pulse arithmetic process performed immediately before the output of the pulse signal as shown in FIG. 6B. That is, the processing unit 162 receives command values of a commanded position and a commanded speed from the CPU unit 13 in advance so that a pulse signal can be output at a prescribed timing (each of the positions indicated by the dashed lines) and calculates the number of pulses and the pulse frequency of the pulse signal at the timing of the output pulse arithmetic process. For example, the processing unit 162 receives command values from the CPU unit 13 in the middle of outputting a pulse signal before a commanded position P1 and a commanded speed V1 (e.g., at a timing at which 70% of the pulse signal has been output) and executes the output pulse arithmetic process in order to output another pulse signal at the timing of the commanded position P1 and the commanded speed V1 shown in FIG. 6B.

In the example described with reference to FIG. 6A, since the command is given with the values of the commanded position and the commanded speed that come within the control cycle, no advance or delay between the commanded position and the commanded speed commanded by the CPU unit 13 and the number of pulses and a pulse frequency of the actually output pulse signal occurs. However, there may be cases in which the commanded position and the commanded speed have values that do not come within the control cycle due to an error between the commanded position and the commanded speed commanded by the CPU unit 13 and the number of pulses and pulse frequency of the output pulse signal. When the commanded position and the commanded speed have values that do not come within the control cycle, the pulse output unit 16 outputs a pulse signal having a timing that is advanced or delayed from a timing prescribed by the CPU unit 13 as a system setting. Specifically, advances and delays of pulse signals from a timing prescribed for the pulse output unit 16 as a system setting will be described with reference to a drawing.

Figure 7A:
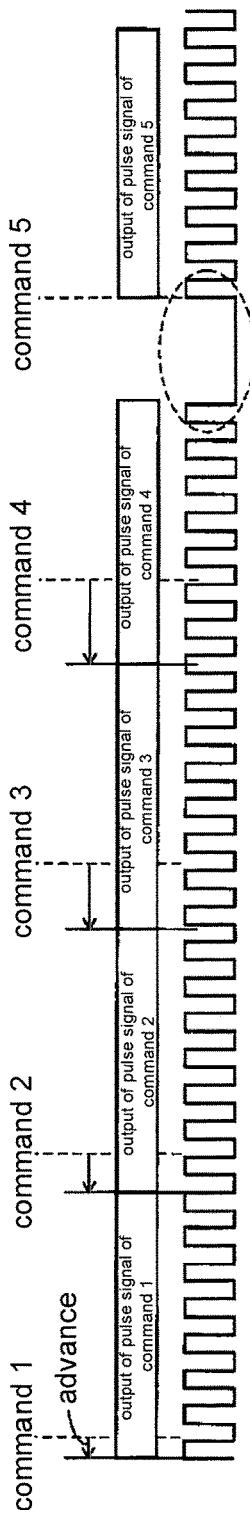
FIG. 7A, FIG. 7B and FIG. 7C are diagrams for describing advances and delays of pulse signals.
Figure 7B:
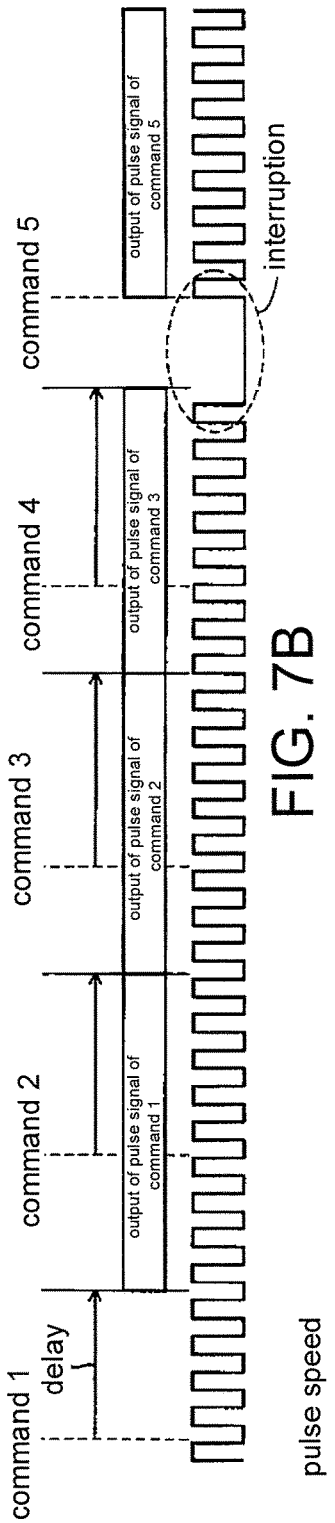
Figure 7C:
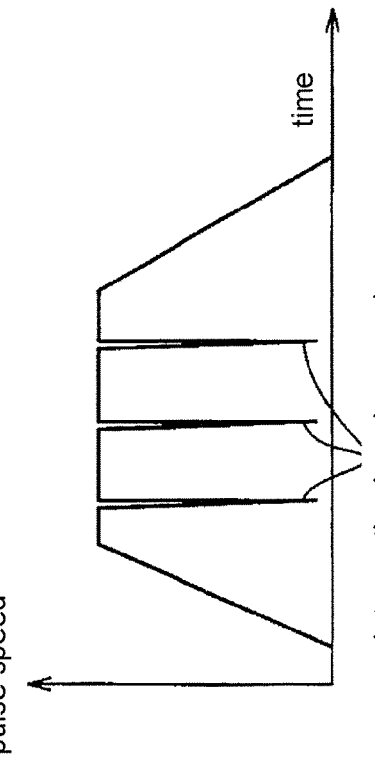

FIG. 7A, FIG. 7B and FIG. 7C are diagrams for describing advances and delays of pulse signals. FIG. 7A, FIG. 7B and FIG. 7C are for describing an example in which the pulse output unit 16 receives command values from the CPU unit 13 to set a pulse speed to be constant, and FIG. 7A shows advances of a pulse signal from prescribed timings. FIG. 7B shows delays of a pulse signal from prescribed timings. For example, when the CPU unit 13 gives a command for a commanded position and a commanded speed so that the number of pulses is 8 and a pulse speed is 8000 pps, 8 pulses are generated at the pulse speed of 8000 pps during a control cycle of 1 ms, and thus neither advance nor delay occurs for a pulse signal as long as the commanded number of pulses is 8.

However, if the value of a calculated number of pulses includes a decimal as a result of calculating the number of pulses that comes within the control cycle based on a commanded position and a commanded speed given by the CPU unit 13, the processing unit 162 rounds off the value of the calculated number of pulses such that it becomes an integer. Thus, the pulse signal has an error due to the part rounded off to be the integer by the processing unit 162. For example, if numbers after the decimal point of the number of pulses, which is calculated by the processing unit 162 based on a commanded position and a commanded speed given by the CPU unit 13, are rounded down to make the number of pulses 7, 8 pulses are generated during 1 ms of the control cycle as long as the pulse frequency is 8000 pps, however, since the commanded number of pulses is 7, the next pulse signal advances forward by one pulse.

In the waveform shown in FIG. 7A, lengths of advances of the output of the pulse signal from prescribed timings increase in the order of command 1, command 2, command 3, and command 4. In a process of outputting pulse signals, the pulse output unit 164 performs a process of connecting a pulse signal of a next control cycle such that it is continuous after output of a pulse signal is started. However, there may be a case in which, if lengths of advances of the output of pulse signals increase, the output of a pulse signal is completed before the process of connecting another pulse signal such that it is continuous is performed. For this reason, the pulse output unit 164 is not capable of generating continuous pulse signals and thus a pulse signal may be interrupted for a time before output of a pulse signal of the next control cycle is started.

Meanwhile, the CPU unit 13 may give a command over a commanded position and a commanded speed to compute the number of pulses to 9 and a pulse frequency to 8000 pps when the processing unit 162 rounds off numbers after the decimal point. In this case, 8 pulses are generated in 1 ms of the control cycle, however, the next pulse signal is delayed by one pulse since the commanded number of pulses is 9.

In the waveform shown in FIG. 7B, output of pulse signals is delayed at prescribed timings (the positions indicated by the dashed lines such as command 1 and the like), and lengths of delays increase in the order of command 1, command 2, command 3, and command 4. Here, the pulse output unit 16 is configured to store, for example, one command value received from the CPU unit 13 in a buffer, and when a command value of command 3 is received in the middle of outputting a pulse signal of command 2, the command value of command 3 is stored in the buffer. However, when output of the pulse signal of command 2 is delayed, a command value of command 4 may be further received in the middle of outputting the pulse signal of command 2, and it is not possible to store the received command value of command 4 in the buffer because the command value of command 3 has already been being stored in the buffer and thus the command value of command 4 is discarded. Then, after the output of the pulse signal of command 2 is completed, the pulse signal of command 3 is output based on the command value of command 3 stored in the buffer, but when it is not possible to receive a command value of command 5 before output of the pulse signal of command 3 is completed, the pulse signals are interrupted as shown in FIG. 7B.

When advances or delays occur in output of the pulse signals at the prescribed timings as shown in FIG. 7A and FIG. 7B without correcting the pulse speeds, interruption occurs in the pulse signals. When interruption occurs in the pulse signals, the pulse speeds radically change. FIG. 7C is a diagram showing changes in a pulse speed when interruption occurs in a pulse signal. The pulse output unit 16 increases a pulse speed after output of a pulse signal is started, for example, holds the pulse speed constant at a certain value, and then performs control to set the pulse speed to be low. However, since interruption occurs in the pulse signal in the period in which the pulse speed is held constant as shown in FIG. 7C, a radical change is made in the pulse speed in a spiking manner. In a case in which a driving device is a motor such as a stepping motor, for example, a motor speed radically changes due to such a radical change in a pulse speed and thus a strange noise or vibration may occur. Furthermore, the motor may not be synchronized with a pulse signal due to the radical change in the motor speed and may be out of step.

Thus, in the pulse output unit 16, the pulse counter 165 counts the number of pulses of a pulse signal actually output by the pulse output unit 164, and the processing unit 162 corrects an error between the counted number of pulses and the number of pulses calculated with respect to a commanded position. Specifically, the processing unit 162 corrects a speed of the pulse signal (a pulse speed) in accordance with the error and reduces an advance or a delay in output of the pulse signal with reference to a command. The pulse output unit 16 corrects the pulse speed in the output pulse arithmetic process (refer to FIG. 6B) executed in each control cycle.

Figure 8:
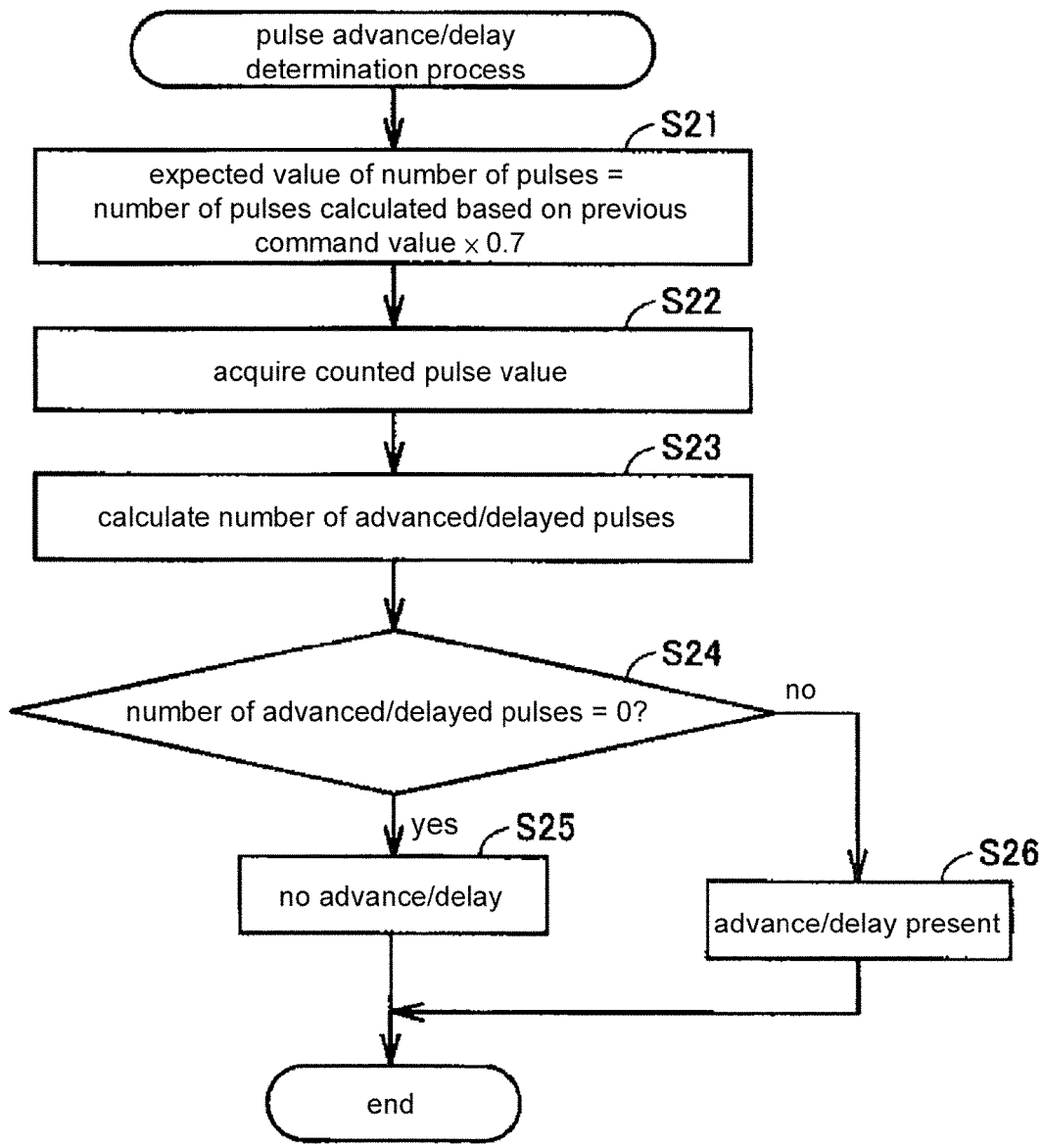
FIG. 8 is a flowchart for describing an output pulse arithmetic process of the pulse output unit according to the embodiment.
Figure 9:
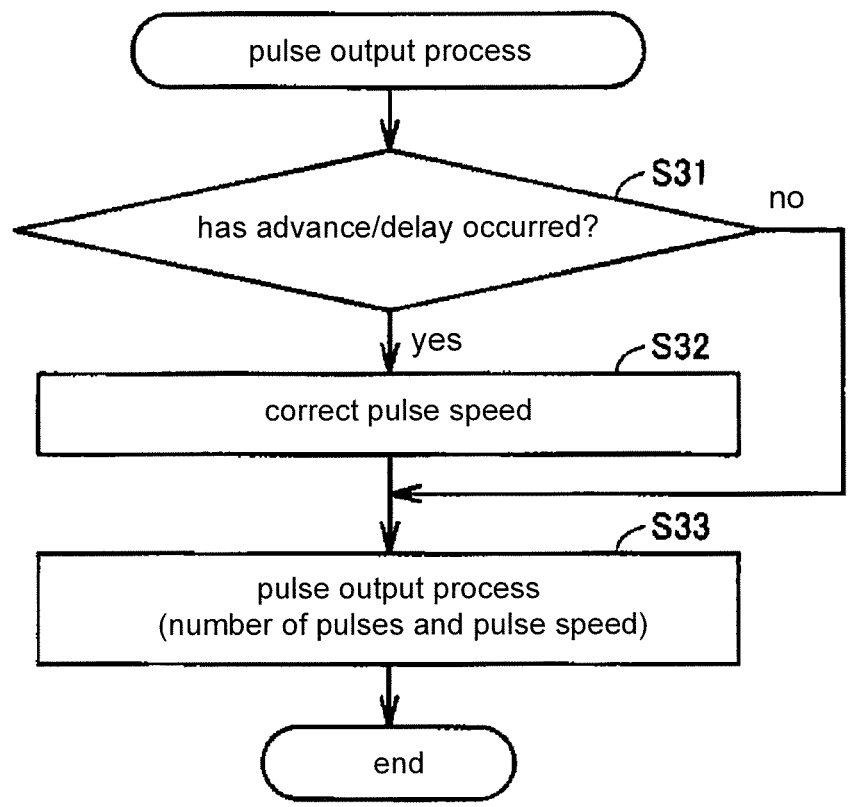
FIG. 9 is a flowchart for describing the output pulse arithmetic process of the pulse output unit according to the embodiment.

The output pulse arithmetic process will be described in more detail. FIG. 8 and FIG. 9 are flowcharts for describing the output pulse arithmetic process of the pulse output unit 16 according to the present embodiment. Note that, in the flowchart shown in FIG. 8, an example in which the output pulse arithmetic process is started at a timing at which 70% of a pulse signal based on a previous command has been output will be described. This timing, however, is only an example and there is no limitation to a timing at which 70% of a pulse signal is output, and any timing is possible as long as the output pulse arithmetic process can be executed at the timing. In the output pulse arithmetic process, two main processes including a pulse advance/delay determination process and a pulse output process are executed. In the pulse advance/delay determination process, first, the number of pulses that is expected at a time point at which a command value is received from the CPU unit 13 and the output pulse arithmetic process is started (a timing at which 70% of a pulse signal based on a previous command has been output) is calculated. In the flowchart shown in FIG. 8, the processing unit 162 calculates the expression "an expected value of the number of pulses=the number of pulses calculated based on the previous command value×0.7 (Step S21) to obtain the expected value of the number of pulses. Specifically, in a case in which the number of pulses calculated based on the previous command value is 120, the expected value of the number of pulses is 120×0.7=84.

Next, in the pulse advance/delay determination process, an advance or a delay in output of the pulse signal at a timing at which the pulse counter 165 acquired a counted pulse value is determined. In the flowchart shown in FIG. 8, the processing unit 162 counts the number of pulses of the pulse signal after the output of the pulse signal based on the previous command value is started to a current time point out of the cumulative number of pulses obtained by the pulse counter 165 shown in FIG. 5 and thereby acquires the counted pulse value (Step S22). Then, the processing unit 162 executes a process of calculating the expression "the number of advanced/delayed pulses=the expected value of the number of pulses calculated in Step S21—the counted pulse value acquired in Step S22 (Step S23) to obtain the number of advanced/delayed pulses. If the counted pulse value acquired in Step S22 is greater than 84 that is the expected value of the number of pulses (e.g., 90), an advance has occurred in the pulse signal and the number of advanced/ delayed pulses has a negative value. On the other hand, if the counted pulse value acquired in Step S22 is smaller than 84 that is the expected value of the number of pulses (e.g., 80), a delay has occurred in the pulse signal and the number of advanced/delayed pulses has a positive value. Next, the processing unit 162 determines whether the number of advanced/delayed pulses calculated in Step S23 is 0 (zero) (Step S24). If the calculated number of advanced/delayed pulses is 0 (zero) (YES in Step S24), the processing unit 162 determines that the output of the pulse signal has not been advanced/delayed from the prescribed timings (Step S25). If the calculated number of advanced/delayed pulses is not 0 (zero) (NO in Step S24), the processing unit 162 determines that the output of the pulse signal has been advanced/delayed from the prescribed timings (Step S26). That is, the processing unit 162 determines that the pulse signal has been advanced if the number of advanced/delayed pulses has a negative value and that the pulse signal has been delayed if the number of advanced/delayed pulses has a positive value.

Next, in the pulse output process, the pulse speed is corrected based on the commanded speed and the calculated number of advanced/delayed pulses. The flowchart shown in FIG. 9 is for describing the pulse output process. First, the processing unit 162 determines whether the output of the pulse signal is determined not to have been advanced/delayed from the prescribed timings in Step S25 shown in FIG. 8 or the output of the pulse signal is determined to have been advanced/delayed from the prescribed timings in Step S26 (Step S31). If the output of the pulse signal is determined to have been advanced/delayed from the prescribed timings in Step S26 (YES in Step S31), the processing unit 162 corrects the pulse speed (Step S32). On the other hand, if the output of the pulse signal is determined not to have been advanced/delayed from the prescribed timings in Step S25 (NO in Step S31), the processing unit 162 skips correction of the pulse speed and performs the pulse output process (Step S33). In the pulse output process, the processing unit 162 outputs the pulse speed corrected in S32 to the pulse output unit 164, instead of the commanded speed based on the command value, and causes the pulse output unit 164 to generate a pulse signal.

Next, the correction of the pulse speed performed in Step S32 will be described in more detail. In the correction of the pulse speed, the pulse speed is set to be lower than the commanded speed if the output of the pulse signal based on the command is advanced, and set to be higher than the commanded speed if the output of the pulse signal based on the command is delayed. However, if the pulse speed is corrected at an excessively large ratio, a significant gap between the commanded speed is made and thus the pulse speed is radically changed. On the other hand, if the pulse speed is corrected at an excessively small ratio, it is difficult to sufficiently correct the advance or delay in the output of the pulse signal based on the command. Thus, the processing unit 162 controls the speed of the pulse signal such that the speed is corrected at a predetermined rate for each control cycle. For example, the processing unit 162 corrects the speed of the pulse signal by 2% or so for each control cycle.

Specifically, a case in which the commanded speed is set to 120,000 pps will be described as an example of the processing unit 162 correcting the speed of the pulse signal by 2% or so for each control cycle. If the processing unit 162 increases the pulse speed by 2%, the pulse speed after correction is 120,000×1.02=122,400 pps. In addition, if the processing unit 162 decreases the pulse speed by 2%, the pulse speed after correction is 120,000×0.98=117,600 pps.

Figure 10A:
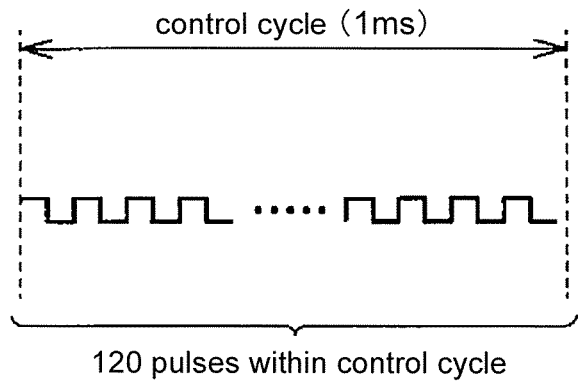
FIG. 10A, FIG. 10B and FIG. 10C are diagrams for describing correction of a pulse speed of a pulse signal.
Figure 10B:
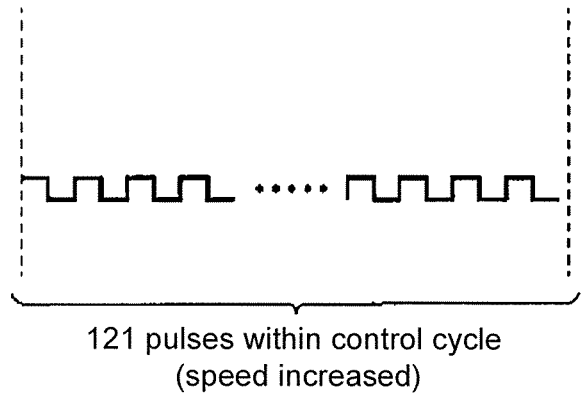
Figure 10C:
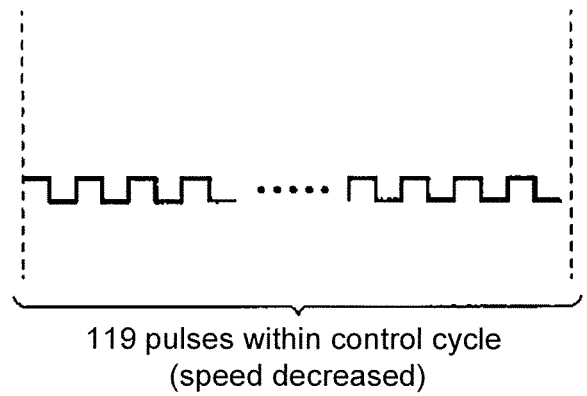

Next, correction of a speed of a pulse signal by 2% or so for each control cycle will be described with reference to a drawing. FIG. 10A, FIG. 10B and FIG. 10C are diagrams for describing correction of a pulse speed of a pulse signal. FIG. 10A shows a case in which, if a commanded speed is set to 120,000 pps, for example, the number of pulses in a control cycle of 1 ms (=0.001 seconds) is 120.

FIG. 10B shows a correction in which the speed of the pulse signal for each control cycle is increased about 0.83%. In FIG. 10B, the commanded speed has the pulse speed after correction obtained by calculating 120,000 pps× 1.083=about 121,000 pps. Thus, in FIG. 10B, the number of pulses in the control cycle of 1 ms (=0.001 seconds) is 121.

On the other hand, FIG. 10C shows a correction in which the speed of the pulse signal for each control cycle is decreased about 0.83%. In FIG. 10C, the commanded speed has the pulse speed after correction obtained by calculating 120,000 pps×0.917=about 119,000 pps. Thus, in FIG. 10C, the number of pulses in the control cycle of 1 ms (=0.001 seconds) is 119.

Figure 11A:
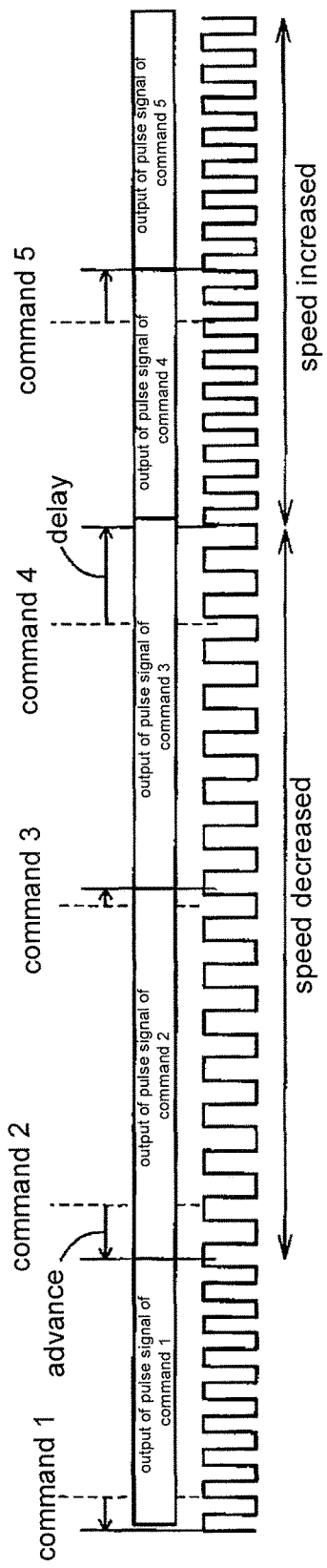
FIG. 11A and FIG. 11B are diagrams for describing a pulse signal after a pulse speed is corrected.
Figure 11B:
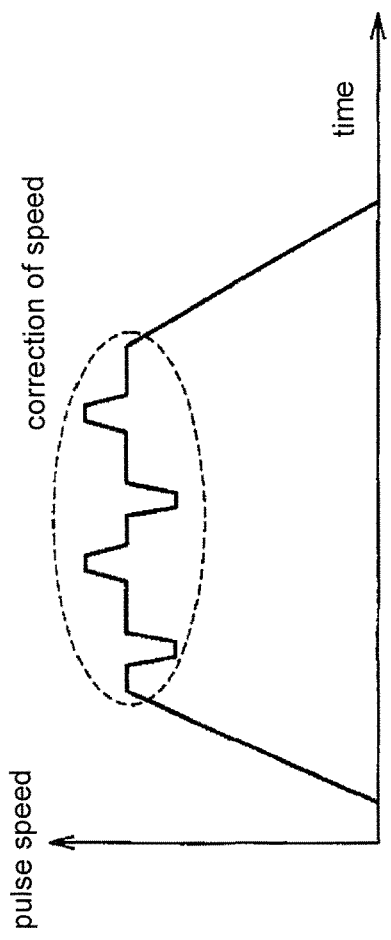

As described above so far, the processing unit 162 of the pulse output unit 16 corrects a speed of a pulse signal (a pulse speed) based on the number of pulses counted by the pulse counter 165. The pulse output unit 16 can thus suppress a radical change in the pulse speed. FIG. 11A and FIG. 11B are diagrams for describing a pulse signal after a pulse speed is corrected.

In the waveform shown in FIG. 11A, although lengths of advances of the output of the pulse signal from the prescribed timings (the positions indicated by the dashed lines including command 1 and the like) increase in order or command 1 and command 2, an advance of the output of the pulse signal from the timing prescribed based on command 3 is cancelled by the pulse output unit 16 to correct and lower the pulse speed. However, by lowering the pulse speed in the correction, delays of the output of the pulse speed from prescribed timings increase in order of command 3 and command 4 in the waveform shown in FIG. 11A. Thus, the pulse output unit 16 corrects and increases the pulse speed for the timing at which the pulse signal is output which is later than the timing prescribed based on command 4. The pulse output unit 16 cancels an advance of the output of the pulse signal from the timing prescribed based on command 5 by correcting and increasing the pulse speed. Note that, since the pulse output unit 16 corrects the pulse speed in the waveform shown in FIG. 11A, no interruption of the pulse signal occurs as shown in FIG. 7A and FIG. 7B.

FIG. 11B is a diagram showing changes in the pulse speed when the pulse speed is corrected. Also in FIG. 11B, the pulse output unit 16, for example, increases the pulse speed after output of the pulse signal is started, holds the pulse speed constant at a certain value, and performs control to reduce the pulse speed thereafter. By correcting the pulse speed in the period in which the pulse speed is held constant, the pulse output unit 16 adjusts the speed to have moderate changes as shown in FIG. 11B in comparison to the radical and spiking changes in the pulse speed as shown in FIG. 7C. Thus, the pulse output unit 16 suppresses a radical change in the pulse speed and, if a driving device is, for example, a motor such as the stepping motors 4A and 4B, the pulse output unit prevents a strange noise or vibration from occurring by suppressing a radical change in a motor speed. Furthermore, since the pulse output unit 16 suppresses such a radical change in the motor speed, the motor can be prevented from losing synchronization with a pulse signal and being out of step.

As described above, the PLC system SYS according to the present embodiment includes the driving devices 30 and 40 constituted by the motor drivers 3A and 3B and the stepping motors 4A and 4B respectively, the CPU unit 13 which commands the number of pulses and a pulse speed of a pulse signal to be output to the driving devices 30 and 40, and the pulse output unit 16 which outputs a pulse signal to the driving devices 30 and 40 based on a command from the CPU unit 13. The pulse output unit 16 includes the clock generation unit 163 which generates a clock signal, the pulse output unit 164 which generates a pulse signal by dividing a frequency of the clock signal and outputs the pulse signal having the number of pulses and a pulse speed commanded by the CPU unit 13 at a prescribed timing, the pulse counter 165 which counts the number of pulses of the output pulse signal, and the processing unit 162 which corrects the pulse speed of the pulse signal generated by the pulse output unit 164 based on an error in the number of pulses. Thus, the pulse output unit 16 corrects an advance or a delay in output of the pulse signal from the prescribed timing and thereby can reduce a radical change in the pulse speed of the pulse signal.

In addition, the CPU unit 13 commands the number of pulses of the pulse signal by commanding a position of a pulse, and the pulse output unit 16 obtains the number of pulses of the pulse signal commanded based on a difference between a commanded position (position data) commanded this time and a commanded position (position data) commanded at a previous time.

Furthermore, when the pulse signal output from the pulse output unit 164 is advanced from the prescribed timing, the processing unit 162 corrects a pulse speed such that it becomes slower than the pulse speed commanded by the CPU unit 13. In addition, when the pulse signal output from the pulse output unit 164 is delayed from the prescribed timing, the processing unit 162 corrects a pulse speed such that it becomes faster than the pulse speed commanded by the CPU unit 13. Thus, by correcting the advance or delay in output of the pulse signal from the prescribed timing, the pulse output unit 16 can suppress a radical change in the pulse speed.

The processing unit 162 corrects a speed of one pulse of a pulse signal for each control cycle in which the CPU unit 13 commands the number of pulses and a pulse speed. Thus, the pulse output unit 16 can change the pulse speed appropriately, without correcting the pulse speed at an excessively large or small ratio.

Modified Examples (1) Although the CPU unit 13 according to the above-described embodiment commands the number of pulses of a pulse signal by commanding a position (a commanded position shown in FIG. 6A and FIG. 6B), this invention is not limited thereto. The CPU unit 13 may calculate the number of pulses of a pulse signal from a difference between a commanded position of this time and a commanded position of a previous time and give a command of a number of pulses directly to the pulse output unit 16.

(2) Although the cause of an advance or a delay of a pulse signal from the pulse output unit 16 according to the above-described embodiment is described to be an error caused by performing rounding off to gain an integer command value (a commanded position and a commanded speed), the invention is not limited thereto. The pulse output unit 16 may cause an advance or a delay of a pulse signal due to, for example, an error derived from a resolution of a pulse speed, an error in hardware of the clock generation unit 163, or the like. Here, an error derived from a resolution of a pulse speed is an error caused due to a pulse speed which can be expressed only to the extent that a frequency of a clock signal of the clock generation unit 163 can be divided (resolution) since a pulse signal output by the pulse output unit 16 is generated by dividing the frequency of the clock signal. An error in hardware of the clock generation unit 163 is an error caused by a change in characteristics including a precision or temperature of elements constituting the clock generation unit 163 or the like.

(3) Although the pulse output unit 16 according to the above-described embodiment has been described as one constituent element of the PLC system SYS, the invention is not limited thereto. The pulse output unit 16 may have a configuration, for example, in which the pulse output unit is connected to a higher-order controller and drives the driving devices.

(4) Although the pulse output unit 16 according to the above-described embodiment has been described as having a configuration of adjusting a pulse speed commanded by the CPU unit 13 and correcting an advance or a delay in output of a pulse signal from a timing prescribed for the pulse output unit 16 as a system setting, the invention is not limited thereto. When interruption occurs in the waveform shown in FIG. 7A, FIG. 7B and FIG. 7C, for example, the pulse output unit 16 may perform correction to cause a pulse signal, which has been output before the interruption, to be continuously output.

The embodiments disclosed herein should be considered to be illustrative, not limitative. The scope of the invention is defined by the claims, not the above description, and all types of modifications made within the intention and scope of the claims are understood as being included in the invention.

What is claimed is:

1. A control system comprising:
a driving device that is driven based on a pulse signal;
a control device that commands the number of pulses and a pulse speed of the pulse signal output to the driving device;
and a pulse output device that outputs the pulse signal to the driving device based on the number of pulses and the pulse speed commanded by the control device,
wherein the pulse output device includes a clock generation unit that generates a clock signal, a pulse output unit that generates the pulse signal by dividing a frequency of the clock signal generated by the clock generation unit and outputs the pulse signal having the number of pulses and the pulse speed commanded by the control device at a prescribed timing, a pulse counter that counts the number of pulses of the pulse signal output from the pulse output unit, and a processing unit that corrects the pulse speed of the pulse signal generated by the pulse output unit based on an error between the number of pulses commanded by the control device and the number of pulses counted by the pulse counter.

2. The control system according to claim 1,
wherein the control device commands the number of pulses of the pulse signal by commanding a position, and
wherein the pulse output device obtains the number of pulses of the pulse signal commanded based on a difference between a position commanded this time and a position commanded at a previous time.

3. The control system according to claim 1, wherein the processing unit corrects, when the pulse signal output from the pulse output unit is advanced from the prescribed timing, a pulse speed such that it becomes slower than the pulse speed commanded by the control device, and when the pulse signal output from the pulse output unit is delayed from the prescribed timing, a pulse speed such that it becomes faster than the pulse speed commanded by the control device.

4. The control system according to claim 3, wherein the processing unit corrects a speed of one pulse of the pulse signal for each control cycle at which the control device commands the number of pulses and the pulse speed.

5. A pulse output device which outputs a pulse signal to a driving device based on the number of pulses and a pulse speed commanded by a control device, the number of pulses and the pulse speed commanded by the control device to be output to the driving device, the pulse output device comprising:
- a clock generation unit that generates a clock signal;
- a pulse output unit that generates the pulse signal by dividing a frequency of the clock signal generated by the clock generation unit and outputs the pulse signal having the number of pulses and the pulse speed commanded by the control device at a prescribed timing;
- a pulse counter that counts the number of pulses of the pulse signal output from the pulse output unit; and
- a processing unit that corrects the pulse speed of the pulse signal generated by the pulse output unit based on an error between the number of pulses commanded by the control device and the number of pulses counted by the pulse counter.

* * * * *